(12) United States Patent
Peng

(10) Patent No.: US 7,184,106 B2
(45) Date of Patent: Feb. 27, 2007

(54) DIELECTRIC REFLECTOR FOR AMORPHOUS SILICON CRYSTALLIZATION

(75) Inventor: Chia-Tien Peng, Chupei (TW)

(73) Assignee: AU Optronics Corporation (TW)

( * ) Notice: Subject to any disclaimer, the term of this patent is extended or adjusted under 35 U.S.C. 154(b) by 74 days.

(21) Appl. No.: 10/788,059

(22) Filed: Feb. 26, 2004

(65) Prior Publication Data

US 2005/0190314 A1    Sep. 1, 2005

(51) Int. Cl.
*G02F 1/136* (2006.01)

(52) U.S. Cl. .......................... 349/42; 349/43; 438/482

(58) Field of Classification Search ............ 349/42–43; 438/482
See application file for complete search history.

(56) References Cited

U.S. PATENT DOCUMENTS

| | | | |
|---|---|---|---|
| 5,058,997 A * | 10/1991 | Dickerson et al. .......... | 349/105 |
| 5,851,862 A | 12/1998 | Ohtani et al. | |
| 6,555,875 B2 | 4/2003 | Kawasaki et al. | |
| 6,602,765 B2 | 8/2003 | Jiroku et al. | |
| 2001/0012702 A1 * | 8/2001 | Kim ............................ | 438/795 |
| 2002/0024586 A1 * | 2/2002 | Nakatsuka et al. ......... | 347/246 |
| 2002/0114563 A1 * | 8/2002 | Tapalian et al. .............. | 385/30 |
| 2004/0004222 A1 * | 1/2004 | Ahn ............................ | 257/72 |
| 2005/0116229 A1 * | 6/2005 | Yoshimoto .................. | 257/66 |

FOREIGN PATENT DOCUMENTS

JP    406140321 A  *  5/1994

* cited by examiner

*Primary Examiner*—David Nelms
*Assistant Examiner*—(Nancy) Thanh-Nhan Phan Nguyen
(74) *Attorney, Agent, or Firm*—Duane Morris LLP

(57) ABSTRACT

A method of forming a liquid crystal display device includes forming an amorphous silicon layer over a substrate and forming a light reflecting layer only over a first portion of the amorphous silicon layer. The amorphous silicon layer is then irradiated with a laser to convert it to a polysilicon layer. The light reflecting layer partially reflects the light away from the first portion of the amorphous silicon layer such that a first portion of the polysilicon layer has a first polysilicon grain size and a second portion of the polysilicon layer has a second polysilicon grain size, which is larger than the first polysilicon grain size. A first plurality of thin film transistors having reduced leakage current characteristics may then be formed from the first portion of the polysilicon layer.

18 Claims, 4 Drawing Sheets

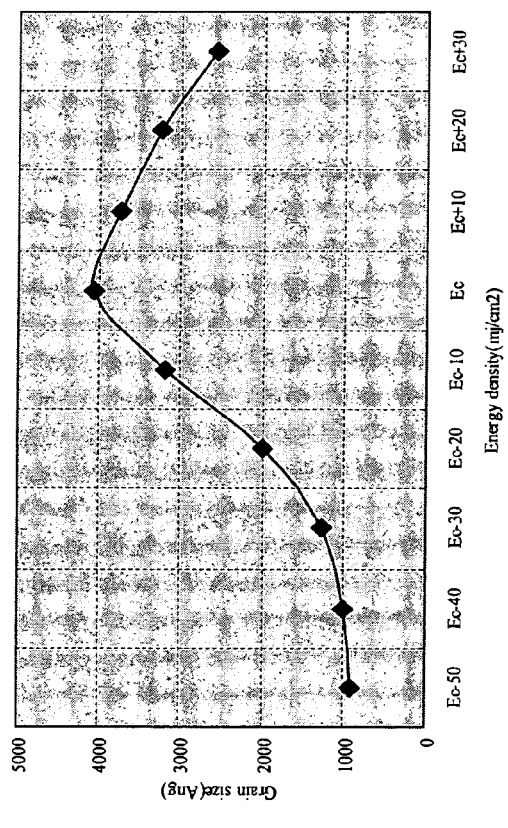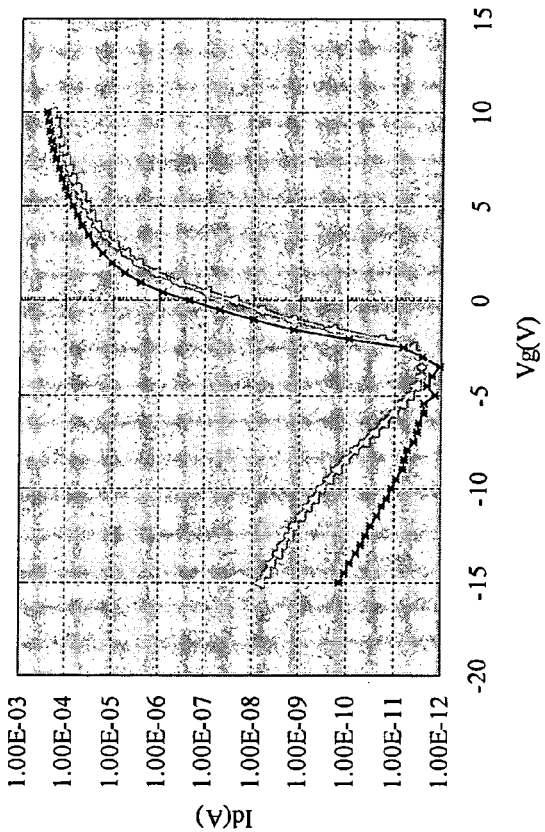

DIELECTRIC REFLECTOR FOR AMORPHOUS SILICON CRYSTALLIZATION

FIELD OF THE INVENTION

The present invention relates to an active matrix liquid crystal display and method of forming the same. In particular, the present invention relates to a liquid crystal display having low temperature polysilicon pixel thin film transistors with reduced leakage current and method of forming the same.

BACKGROUND OF THE INVENTION

An active matrix liquid crystal display (LCD) typically comprises a glass or quartz substrate having formed thereon a plurality of pixel electrodes and switching devices. The pixels are defined by connected gate lines and data lines. Each pixel comprises a storage capacitor and a pixel electrode connected to the switching devices. An LCD employing thin film transistors (TFTs) as the pixel switching devices, provides advantages of low power consumption, thin profile, light weight and low driving voltage. With applications in desktop computer and other monitors, and notebooks, TFT LCDs are presently the most common type of display.

To provide an affordable active matrix LCD, it is desirable to reduce the cost associated with the fabrication of the integrated circuits which drive the pixel TFTs. To this end, low temperature polysilicon (LTPS) TFT LCDs have been developed. In LTPS, an amorphous silicon is deposited onto a substrate and then annealed with laser energy provided, for example, by an excimer laser. The laser annealing process crystallizes the amorphous silicon thereby forming polycrystalline silicon (polysilicon) with large, uniform grains. With LTPS TFT technology, the driver and other related circuits, that are usually located external to the substrate, may be fabricated on a peripheral circuit region of the substrate adjacent to the pixel TFTs (which are fabricated on a pixel region of the substrate).

For an active matrix LCD, the LTPS TFTs of the peripheral circuit region should have high mobility and on-state current characteristics and the LTPS TFTs of the pixel region should have low leakage current characteristics. However, because the polysilicon grains are large, the polysilicon is not conducive to making TFTs with low leakage current characteristics.

Thus, in order to achieve such characteristics, prior art active matrix LCDs employed LDD or offset structures to reduce leakage current of the pixel LTPS TFTs. Such structures, however, undesirably require additional mask and implantation processes and equipment. In addition, these structures reduce the device mobility of the peripheral circuit TFTs.

SUMMARY OF THE INVENTION

A first aspect of the invention comprises a method of forming a liquid crystal display device. The method comprises the steps of: providing a substrate; forming an amorphous silicon layer over the substrate; forming a light reflecting layer only over a first portion of the amorphous silicon layer; irradiating the amorphous silicon layer with light to convert it to a polysilicon layer, the light reflecting layer partially reflecting the light away from the first portion of the amorphous silicon layer wherein a first portion of the polysilicon layer has a first polysilicon grain size and a second portion of the polysilicon layer has a second polysilicon grain size, which is larger than the first polysilicon grain size, the first portion of the polysilicon layer being derived from the first portion of the amorphous silicon layer; and forming a first plurality of thin film transistors from the first portion of the polysilicon layer.

A second aspect of the invention is a liquid crystal display device. The display device comprises: a substrate; a polysilicon layer disposed over the substrate, the polysilicon layer having a first portion with a first polysilicon grain size and a second portion with a second polysilicon grain size, which is larger than the first polysilicon grain size; and a plurality of thin film transistors formed from the first portion of the polysilicon layer.

A third aspect of the invention is a method of crystallizing amorphous silicon formed over a substrate to form a polysilicon layer having regions of different polysilicon grain sizes. The method comprises the steps of: forming a light reflecting layer only over a first portion of the amorphous silicon layer; and irradiating the amorphous silicon layer with light to convert it to a polysilicon layer, the light reflecting layer partially reflecting the light away from the first portion of the amorphous silicon layer wherein a first portion of the polysilicon layer has a first polysilicon grain size and a second portion of the polysilicon layer has a second polysilicon grain size, which is larger than the first polysilicon grain size, the first portion of the polysilicon layer being derived from the first portion of the amorphous silicon layer.

BRIEF DESCRIPTION OF THE DRAWINGS

FIG. 8 is a graph showing the relationship between polysilicon grain size (y-axis) and excimer laser annealing (ELA) energy density (x-axis).

FIG. 9 is a graph showing the relationship between drain current and gate voltage for TFTs of varying polysilicon grain size.

DETAILED DESCRIPTION

Figure 1A:
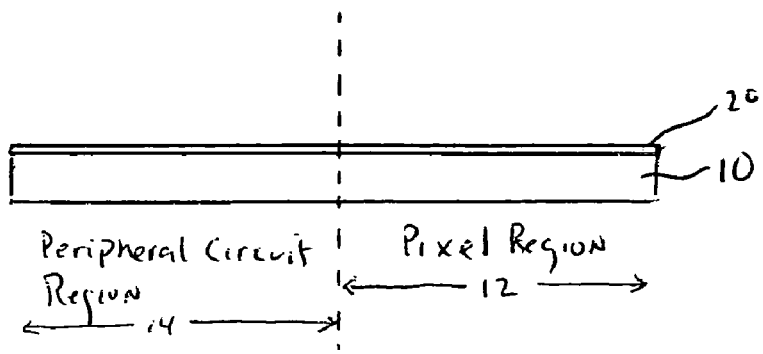
FIGS. 1A–1C, 2, 3, 4, and 5 are sectional views illustrating the use of a reflection layer to form pixel thin film transistors with reduced leakage current characteristics on a substrate forming an LCD panel of an active matrix LCD device.

Referring to FIG. 1A, an insulating substrate 10 is provided which will form an LCD panel of an active matrix LCD device. The substrate 10 is made, for example, of glass and includes a pixel region 12 upon which pixel TFTs will be formed and a peripheral circuit region 14 upon which driver and other TFTs will be formed. A buffer layer 20 made of one or more films of dielectric material, such as silicon oxide, silicon nitride and combinations thereof, is formed over the substrate 10. The films of the buffer layer 20 may be formed using, for example, a chemical vapor deposition process and/or a physical vapor deposition process, and may have a thickness ranging between about 0.15 microns and about 0.3 microns.

Figure 1B:
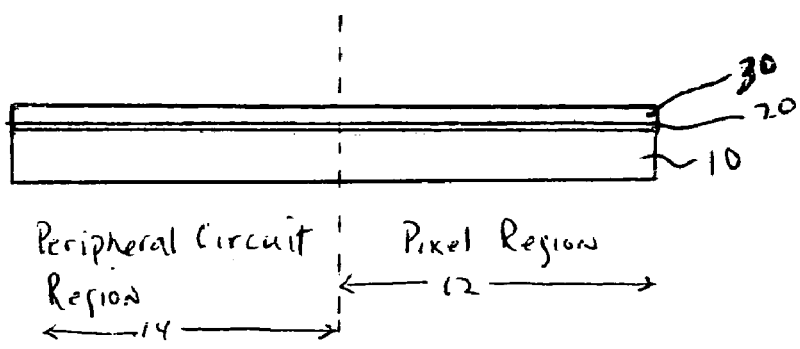

In FIG. 1B, a semiconductor layer 30 of amorphous silicon (a-Si) is formed over the buffer layer 20. The a-Si layer 30 may be formed using a chemical vapor deposition or physical vapor deposition process, and may have a thickness ranging between about 0.04 microns and about 0.06 microns.

Figure 1C:
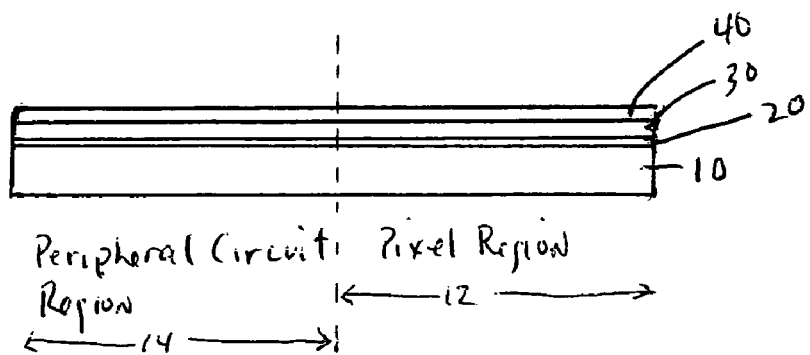

In FIG. 1C, a dielectric reflection layer 40 is formed over the a-Si layer 30. The dielectric reflection layer may be made from one or more dielectric films. These dielectric films may include, for example, silicon oxide, tantalum oxide, silicon nitride, and combinations thereof. The number and composition of the films depend upon the amount reflection that is desired and the wavelength of the light to be reflected thereby. The films of the dielectric reflection layer 40 may be formed using a plasma enhanced chemical vapor deposition process or evaporation process, and the overall thickness of the dielectric typically ranges between about 0.07 microns and about 1.5 microns.

Figure 2:
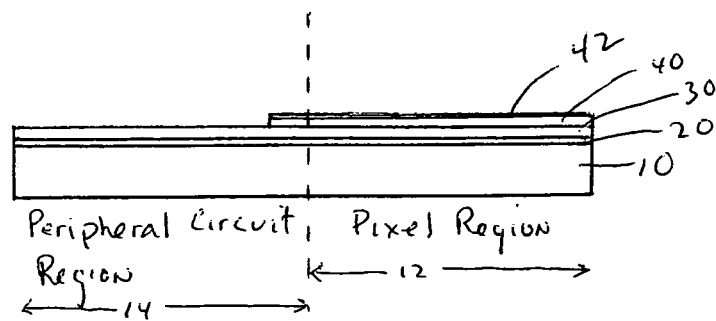

As shown in FIG. 2, a portion of the reflection layer 40 covering the peripheral circuit region 14 of the substrate 10 is removed. Reflection layer portion may be removed using a wet etch process, for example. Remaining portion 42 of the reflection layer 40 covers the an area of the a-Si layer 30 disposed over the pixel region 12 of the substrate 10.

Figure 3:
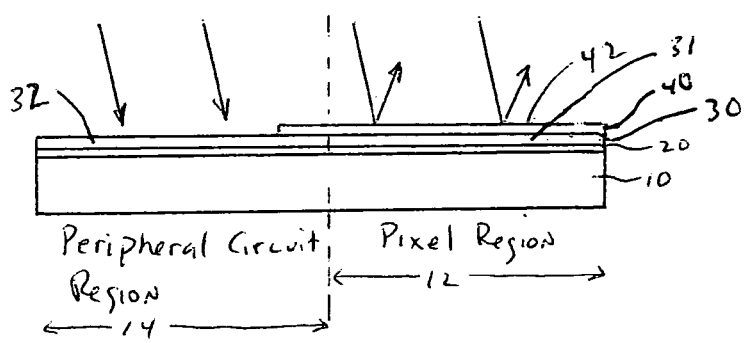

In FIG. 3, a laser annealing step is performed to crystallize the a-Si layer 30 thereby converting it to polycrystalline silicon (polysilicon). This may be accomplished by irradiating the a-Si layer 30 with a laser including, for example, an excimer laser or a green laser, having a wavelength of, for example, 308 nm for the excimer laser or 532 mm for the green laser. Lasers with other wavelengths may also be used, e.g., 247 nm. The laser annealing step is performed at a temperature less than 600° C., which is conventional for LTPS.

The remaining portion 42 of the reflection layer 40 operates to a reflect some of the laser light away from portion 31 of the a-Si layer 30 covering the pixel region 12 of the substrate 10, thus reducing the energy density encountered by a-Si layer portion 31, and therefore, converting a-Si layer portion 31 of the a-Si layer 30 to polysilicon having a reduced polysilicon grain size, e.g., less than about 0.1 microns in diameter. Portion 32 of the a-Si layer 30 covering the peripheral circuit region 14 of the substrate 10 encounters the full energy density of the laser light, therefore, a-Si layer portion 32 is converted to polysilicon having polysilicon grains of a large size, e.g. about 0.3 to 0.4 microns in diameter. Accordingly, the dielectric film or films which form the reflection layer 30 should be capable of reflecting the wavelength of the laser light used in the laser annealing process. The amount of reflectance provided by the reflection layer 30, which can be anywhere for about 1 to about 99 percent, depends upon the refractive index (n) and the overall thickness of the reflection layer 30.

Figure 4:
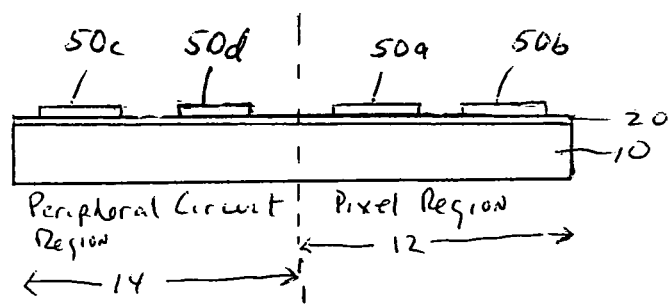

Referring to FIG. 4, if the film or films of the reflection layer 40 is composed of a nitride material, then the reflection layer 40 is removed (as shown) in a wet etch process, and the polysilicon layer is patterned into islands 50a–d (only four islands are shown for purposes of clarity only). If the film or films of the reflection layer 40 is an oxide material, then the reflection layer 40 may form a layer in the final pixel TFT structure. Pixel TFTs are constructed on the pixel region 12 of the substrate 10 from polysilicon islands 50a and 50b having the reduced size polysilicon grains and peripheral circuit TFTs are constructed on the peripheral circuit region 14 of the substrate 10 from polysilicon islands 50c and 50d having the large size polysilicon grains.

Figure 5:
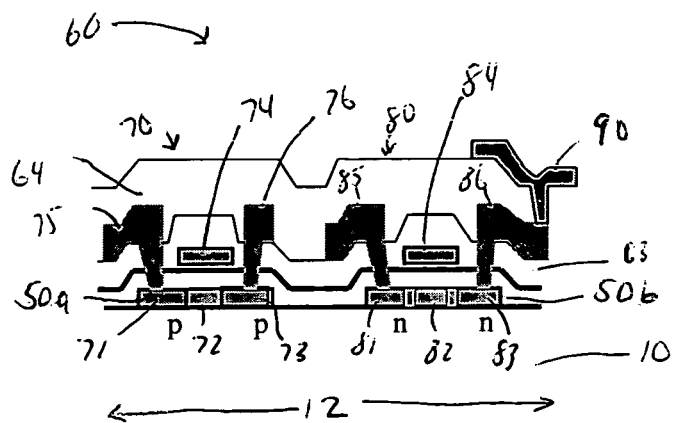

FIG. 5 is a sectional view through a pixel TFT structure 60 made according to the present invention. The pixel TFT structure 60 comprises a complementary transistor structure including PMOS transistor 70 formed from polysilicon island 50a (FIG. 4) and NMOS transistor 80 formed from polysilicon island 50b (FIG. 4). The PMOS transistor 70 includes source region 71, channel region 72, and drain region 73 formed in the polysilicon island 50a, and the NMOS transistor includes source region 81, channel region 82, and drain region 83 formed in the polysilicon island 50b. Gate electrodes 74 and 84 for PMOS transistor 70 and NMOS transistor 80 respectively, are formed on a first insulating layer 62. Source and drain connections 75 and 76 for PMOS transistor 70 and source and drain connections 85 and 86 for NMOS transistor 80 are formed over second insulating layer 63. A pixel electrode 90 is formed over third insulating layer 64 and may be electrically connected with the drain region 83 of the NMOS transistor. The TFT structure 60 operates to switch the pixel electrode 90 on and off when appropriate voltages are applied to structure 60.

Figure 6:
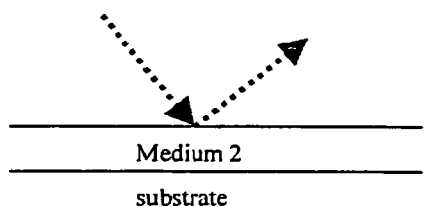
FIG. 6 is a sectional view illustrating laser light being reflected from a reflection layer formed of a single film of dielectric material.

FIG. 6 depicts laser light being reflected from a reflection layer (medium 2 in FIG. 6) formed of a single film of dielectric material. The reflectance of a single film reflection layer may be determined, assuming laser light of a normal incidence angle (0 degrees), according to the following formulas:

$$R(\text{reflectance}) = [(n^E - n_1)/(n_E + n_1)]^2 = [(n_2^2/n_s) - n_1)]/[(n_2^2/n_s) + n_1)]^2$$

where, $n_2$ is the refractive index of the single film of the reflection layer, and $n_1$ is the refractive index of air (n=1 for all wavelengths of light);

$$n_2 * d = \lambda/4$$

where, d is the thickness of the single film of the reflection layer, and $\lambda$ is the wavelength of incidence laser light; and $$n_E = n_2^2/n_S$$

($n_S$ the index of the glass substrate).

Using the above formulas, if the single film of the reflection layer is silicon oxide, which has a refractive index of 1.46, then $R = [(1.46^2/1.52 - 1)/(1.46^2/1.52 + 1)]^2 = 2.7$ percent. If the single film of the reflection layer is silicon nitride, which has a refractive index of 2, then $R = [(2^2/1.52 - 1)/(2^2/1.52 + 1)]^2 = 45.0$ percent.

As can be seen from the above results, dielectric film materials with higher refractive indexes have greater reflectance than dielectric film materials with comparatively lower refractive indexes.

Figure 7:
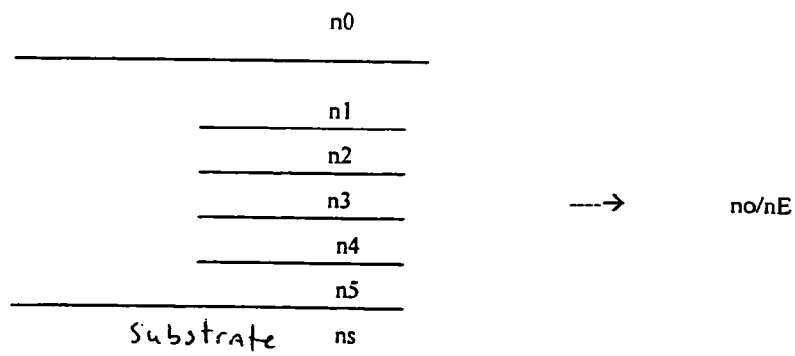
FIG. 7 is a sectional view illustrating laser light being reflected from a reflection layer formed of multiple films of dielectric material.

FIG. 7 depicts laser light being reflected from a reflection layer formed of multiple films of dielectric material. The reflectance of a multi-film reflection layer may be determined according to the following formulas:

$$n_E = (n_1 \times n_3 \times n_5)^2 / [(n_2 \times n_4)^2 \times n_s],$$

$n_i$ refractive index of the ith layer, $$R = [(n_0 - n_E)/(n_0 + n_E)]^2$$

Using the above formulas, if the wavelength of the incident laser light=308 nm, $n_1$=2.15, $n_2$=1.46, the index of the substrate ($n_S$)=1.52 at $\lambda$=308 nm, $n_1 = n_3 = n_5$, $n_2 = n_4$, and the refractive index of air ($n_0$)=1, then R=76.0 percent.

FIG. 8 is a graph showing the relationship between polysilicon grain size (y-axis) and excimer laser annealing (ELA) energy density (x-axis). As can be observed, Ec is the optimal ELA energy density (the energy density that produces the largest polysilicon grain size).

FIG. 9 is a graph showing the relationship between drain current Id in amps (A) and gate voltage Vg in volts (V) for TFTs of varying polysilicon grain size wherein ED stands for energy density, ED1, ED2, and ED3 are different energy densities and ED1 is greater than ED2 and ED2 is greater than ED3. This graph demonstrates that TFTs with larger grain size exhibit higher leakage currents.

While the foregoing invention has been described with reference to the above, various modifications and changes can be made without departing from the spirit of the invention. Accordingly, all such modifications and changes are considered to be within the scope of the appended claims.

What is claimed is:

1. A method of forming a liquid crystal display device, the method comprising the steps of:
   providing a substrate;
   forming an amorphous silicon layer over the substrate;
   forming at least one dielectric film only over a first portion of the amorphous silicon layer, the at least one dielectric film capable of partially reflecting light;
   irradiating the amorphous silicon layer with light to convert it to a polysilicon layer, the at least one dielectric film partially reflecting the light away from the first portion of the amorphous silicon layer wherein a first portion of the polysilicon layer has a first polysilicon grain size and a second portion of the polysilicon layer has a second polysilicon grain size which is larger than the first polysilicon grain size, the first portion of the polysilicon layer being derived from the first portion of the amorphous silicon layer; and
   forming a first plurality of thin film transistors from the first portion of the polysilicon layer.

2. The method according to claim 1, wherein the first plurality of thin film transistors comprise switching devices for pixel electrodes of the liquid crystal display device.

3. The method according to claim 1, wherein the irradiating step is performed with a laser.

4. The method according to claim 3, wherein the laser comprises one of an excimer laser and a green laser.

5. The method according to claim 1, wherein the at least one dielectric film is composed of an oxide material.

6. The method according to claim 1, wherein the at least one dielectric film is composed of a nitride material.

7. The method according to claim 1, further comprising the step of forming a second plurality of thin film transistors from the second portion of the polysilicon layer.

8. The method according to claim 1, further comprising the step of forming a buffer layer over the substrate prior to the step of forming the amorphous silicon layer and forming the amorphous silicon layer over the buffer layer.

9. A liquid crystal display device comprising:
   a substrate;
   a polysilicon layer disposed over the substrate, the polysilicon layer having a first portion with a first polysilicon grain size and a second portion with a second polysilicon grain size, which is larger than the first polysilicon grain size;
   at least one dielectric film disposed over the first portion of the polysilicon layer, the at least one dielectric film cable of partially reflecting light; and
   a plurality of thin film transistors formed from the first portion of the polysilicon layer.

10. The display device according to claim 9, wherein the at least one dielectric film is composed of an oxide material.

11. The display device according to claim 9, wherein the at least one dielectric film is composed of a nitride material.

12. The display device according to claim 9, further comprising a second plurality of thin film transistors formed from the second portion of the polysilicon layer.

13. The display device according to claim 9, further comprising a buffer layer disposed between the substrate and the polysilicon layer.

14. A method of crystallizing amorphous silicon formed over a substrate to form a polysilicon layer having regions of different polysilicon grain sizes, the method comprising the steps of:
   forming at least one dielectric film only over a first portion of the amorphous silicon layer, the at least one dielectric film capable of partially reflecting light; and
   irradiating the amorphous silicon layer with light to convert it to a polysilicon layer, the at least one dielectric film partially reflecting the light away from the first portion of the amorphous silicon layer wherein a first portion of the polysilicon layer has a first polysilicon grain size and a second portion of the polysilicon layer has a second polysilicon grain size which is larger than the first polysilicon grain size, the first portion of the polysilicon layer being derived from the first portion of the amorphous silicon layer.

15. The method according to claim 14, wherein the irradiating step is performed with a laser.

16. The method according to claim 15, wherein the laser comprises one of an excimer laser and a green laser.

17. The method according to claim 14, wherein the at least one dielectric film is composed of an oxide material.

18. The method according to claim 14, wherein the at least one dielectric film is composed of a nitride material.

* * * * *